(12) United States Patent
Varrey et al.

(10) Patent No.: US 11,815,428 B1
(45) Date of Patent: Nov. 14, 2023

(54) DIRECT LEAK DETECTION FOR LIQUID COOLED SERVERS

(71) Applicant: ZT Group Int'l, Inc., Secaucus, NJ (US)

(72) Inventors: Mahesh Kumar Varrey, Secaucus, NJ (US); Chen An, Secaucus, NJ (US)

(73) Assignee: ZT Group Int'l, Inc., Secaucus, NJ (US)

( * ) Notice: Subject to any disclaimer, the term of this patent is extended or adjusted under 35 U.S.C. 154(b) by 313 days.

(21) Appl. No.: 17/388,309

(22) Filed: Jul. 29, 2021

(51) Int. Cl.
| | |
|---|---|
| *G01M 3/16* | (2006.01) |
| *G01M 3/18* | (2006.01) |
| *G01M 3/04* | (2006.01) |
| *H01B 7/18* | (2006.01) |
| *G01R 27/00* | (2006.01) |

(52) U.S. Cl.
CPC ............ *G01M 3/165* (2013.01); *G01M 3/04* (2013.01); *G01M 3/18* (2013.01); *G01R 27/00* (2013.01); *H01B 7/1875* (2013.01)

(58) Field of Classification Search
CPC ...... G01N 27/12; G01N 27/126; G01R 27/00; G01R 27/02; G01R 27/08; G01M 3/00; G01M 3/04; G01M 3/045; G01M 3/165; G01M 3/18; G01F 1/684; G01F 1/696; G01F 15/00; G01F 15/002; G01F 15/005; G01L 3/00; G01L 5/00; G01L 5/0076; F04C 2/1075
See application file for complete search history.

(56) References Cited

U.S. PATENT DOCUMENTS

| | | | | | |
|---|---|---|---|---|---|
| 4,910,998 | A | * | 3/1990 | Willis ................. | G01M 3/045 174/29 |
| 5,355,720 | A | * | 10/1994 | Bailey ................. | G01M 3/165 73/40 |
| 8,963,565 | B2 | * | 2/2015 | Pfeiffer .............. | G01N 27/126 436/143 |
| 2009/0169364 | A1 | * | 7/2009 | Downton ............. | F04C 2/1075 29/888.023 |
| 2017/0115148 | A1 | * | 4/2017 | Sasaki ................. | G01F 15/002 |
| 2018/0246651 | A1 | * | 8/2018 | Sakaguchi .......... | G06F 3/0605 |
| 2021/0356349 | A1 | * | 11/2021 | Raymond ............ | G01M 3/047 |

OTHER PUBLICATIONS

NPL Search (Jul. 24, 2023).*

* cited by examiner

*Primary Examiner* — Van T Trieu
(74) *Attorney, Agent, or Firm* — Dergosits & Noah LLP; Todd A. Noah

(57) ABSTRACT

An apparatus and system are provided for detecting leaks in cooling tubing using sensor cabling. In the leak detection system, a leak detection cable is routed along the full length of the cooling tube. The leak detection cable and the cooling tubing are encased within a shrunken tube, which leaves such a small gap between the cooling tubing and the heat-shrunk tube that leakage is distributed within the gap about the outside of the cooling tubing by capillary action. The relative position of the detection cable above or below the cooling tubing is then irrelevant, since the capillary action may overcome the effect of gravity and distribute leakage from the bottom of the tubing to a detection cable at the top of the tubing.

13 Claims, 3 Drawing Sheets

DIRECT LEAK DETECTION FOR LIQUID COOLED SERVERS

BACKGROUND

Rapid leak detection in liquid cooled servers with cold plates and their tubing is very important, e.g., to minimize datacenter downtimes. The leak may infiltrate and damage both the leaking device and devices situated below the leak. The leak may simply promote corrosion of the rack or device chassis. And a catastrophic leak amounting to a system failure may result in the device overheating.

A typical method of leak detection is to use spot detectors or leak detection cables placed or routed through areas where leaked liquid might flow or pool.

A typical solution attaches a leak detection cable to the tubing intermittently using cable clips. In such a method it is almost impossible to perfectly route the cable along the entire path of the tubing such that the cable is always on the bottom of the tubing, where leakage would most likely be found.

Thus, there is a need for a leak detection system that that would detect a leak along tubing regardless of the orientation of the detecting cable along the tubing.

BRIEF DESCRIPTION OF THE DRAWINGS

The embodiments are illustrated by way of example and not limitation in the accompanying drawings, in which like references indicate similar elements, and in which.

DETAILED DESCRIPTION

Embodiments described within disclose a leak detection system in which a leak detection cable is routed along substantially the full length of the cooling tube. The leak detection cable and the tubing are encased within a heat-shrunk tube, which leaves such a small gap between the tubing and the heat-shrunk tube that leakage is distributed about the outside of the tubing by capillary action. Thus, the relative position of the detection cable above or below the cooling tubing becomes irrelevant, since the capillary action may overcome the effect of gravity and distributes a leak from the bottom of the tubing to the top of the tubing. As a result, embodiments employ that capillary action to distribute leakage about the cooling tubing, which allows leak detection cable within the heat-shrunk tubing to be located anywhere about the circumference of the cooling tubing.

In an embodiment, heat-shrunk tubing wraps a leak detection cable to a cooling tube from joint to joint. A fine gap created between the heat shrink and the cooling tube spreads any leakage within the gap and all around the cooling tube through capillary action, even against the pull of gravity.

Thus, embodiments may ignore the orientation of the cable as to whether the detection cable is above or below the cooling tube, which facilitates both leak detection and assembly of the leak detection system. Moreover, the heat-shrunk tubing adds an extra layer of protection to the cooling tube, increasing its service life.

Features provide by embodiments include: 1) the enhanced detection of leakage through quick distribution of liquid in the gap from the point of leakage to the detection cable by capillary action; and 2) the addition of a protecting layer of heat-shrunk tubing, which guards against damage to the cooling tube.

Figure 1:
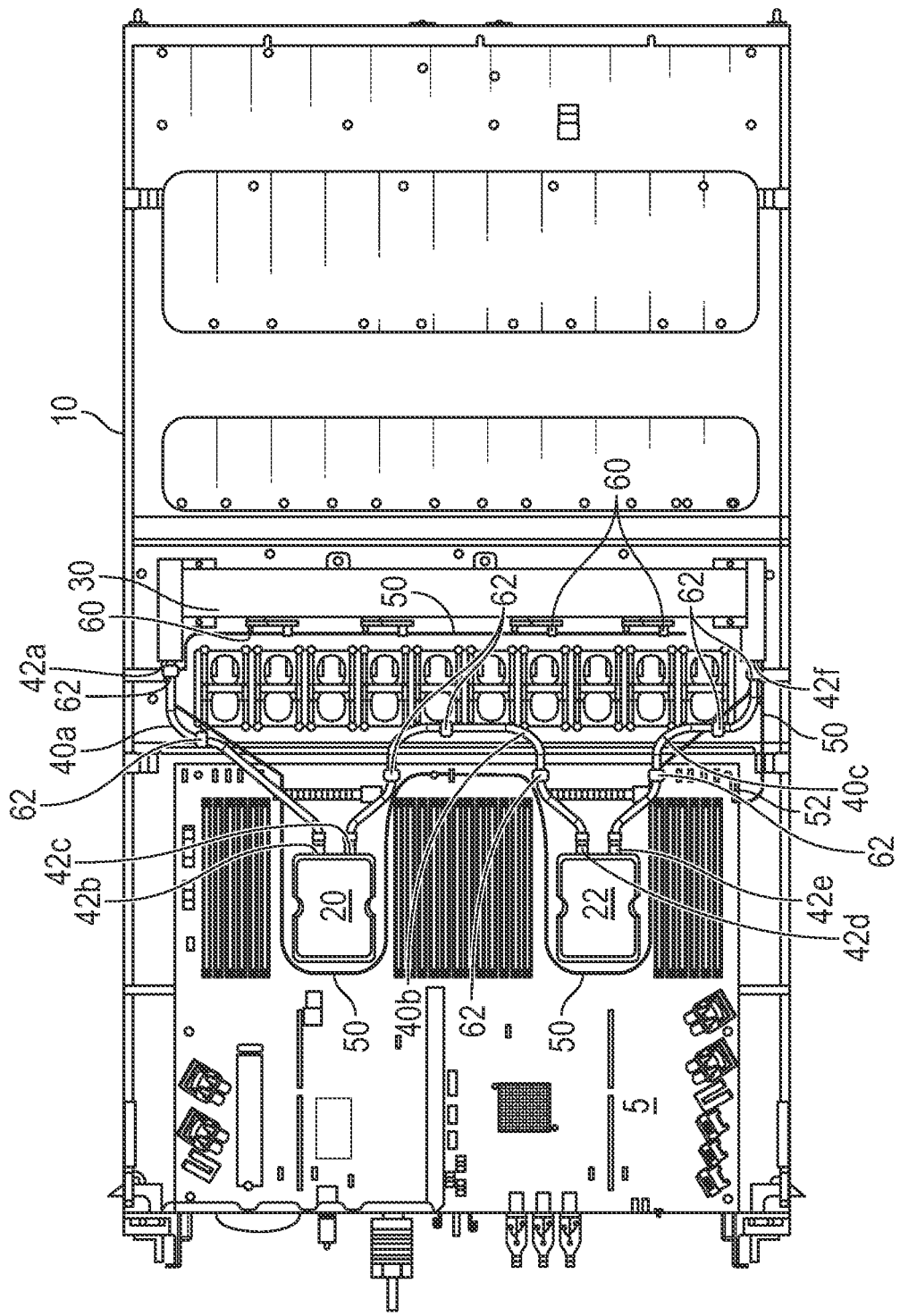
FIG. 1 is a top view of a prior art leak detection apparatus.

FIG. 1 is a top view of a prior art leak detection apparatus. In FIG. 1, a motherboard 5 within a server 10 is cooled by two cold plates 20, 22. Cooling fluid is circulated between cold plates 20, 22 by a cooling tube segment 40b, between cold plate 20 and a dual in-line memory module (DIMM) cooling structure 30 by a cooling tube segment 40a, and between DIMM cooling structure 30 and cold plate 22 by a cooling tube segment 40c. Cooling tube segments 40a . . . 40c are connected to cold plates 20, 22 and DIMM cooling structure 30 using tube couplings 42a . . . 42f. A sensor cable (i.e., a leak detection cable) 50 is routed generally along the route of coolant flow along cold plates 20, 22, DIMM cooling structure 30 and cooling tube segments 40a . . . 40c. Sensor cable 50 is connected at various locations to cooling tube segments 40a . . . 40c using clips 62 and to DIMM cooling structure 30 using clips 60. Sensor cable 50 is connected to motherboard 5 at a connection point 52. A signal from sensor cable 50 is provided to motherboard 5 at connection point 52. Motherboard 5 is equipped with a microprocessor and software to interpret the signal and a provide a notification of a leak. In an embodiment, motherboard 5 passes an electrical signal through sensor cable 50. Motherboard 5 monitors the electrical signal. When fluid contacts sensor cable 50 and causes a change in the electrical properties of cable 50, the change is detected by motherboard 5. Motherboard 5 then provides an alert of leakage.

Figure 2A:
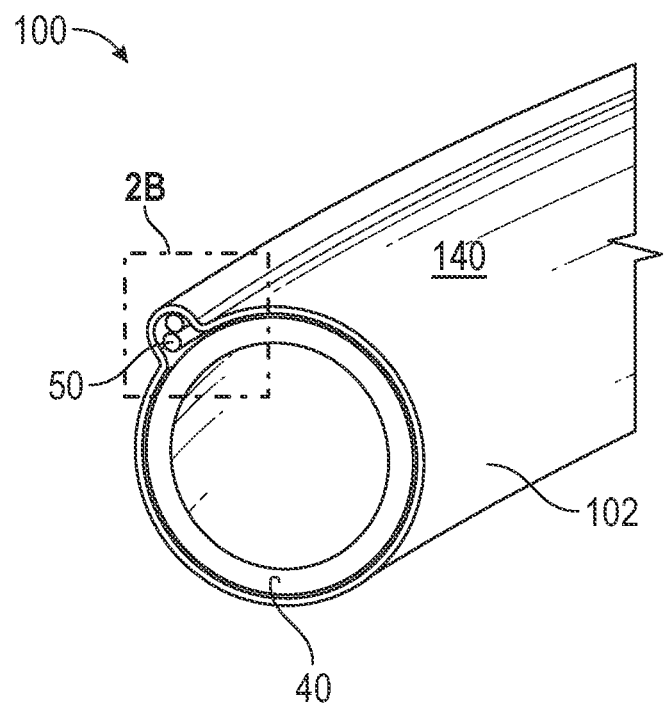
FIG. 2A is an isotropic end view of an embodiment of a leak detection apparatus.

FIG. 2A is an isotropic end view of a cooling tube assembly 140 of an embodiment of a leak detection system 100. In FIG. 2A, cooling tube assembly 140 includes a leak detecting sensor cable 50 disposed along the length of a cooling tube segment 40. In cooling tube assembly 140, cable 50 and cooling tube 40 are then encased in a heat-shrink tubing or wrap 102. Heat-shrink tubing or wrap 102 is shown in its post-shrink state, not its pre-shrink state.

Figure 2B:
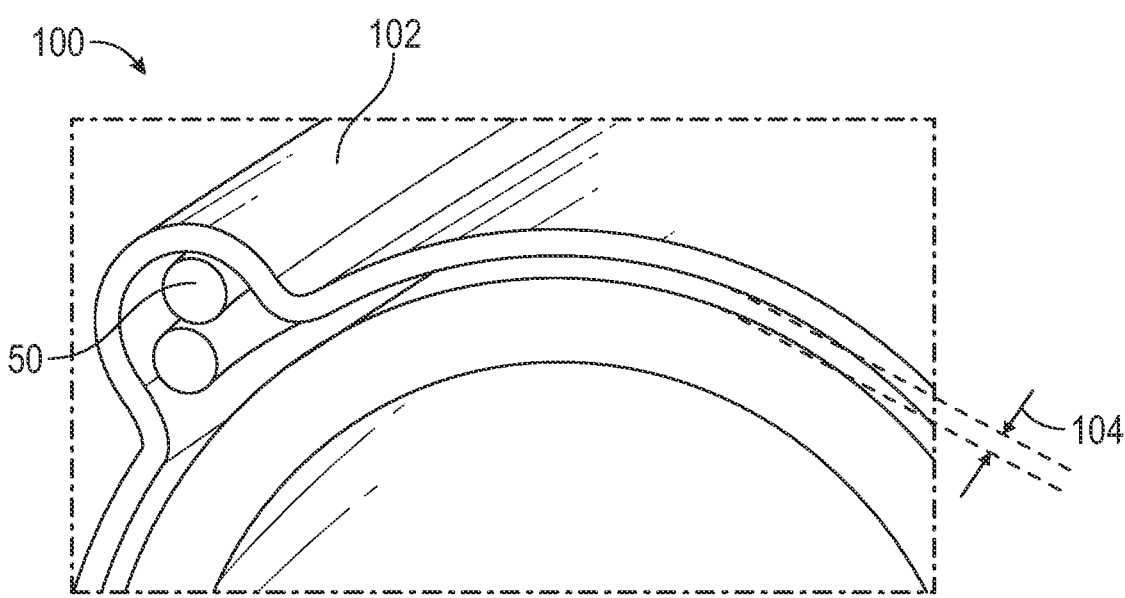
FIG. 2B is an isotropic end view of a detail of the embodiment of FIG. 2A.

FIG. 2B is an isotropic end view of cooling tube assembly 140. In FIG. 2B, after cable 50 and cooling tube 40 are encased in heat-shrink tubing or wrap 102, heat is applied to assembly 140, causing shrink tubing or wrap 102 to shrink and form tightly about cooling tube segment 40 as shown in FIG. 2A and FIG. 2B, which sandwiches cable 50 between tube 40 and wrap 102. However tightly shrink tubing or wrap 102 forms about cooling tube segment 40, shrink tubing or wrap 102 does not bond to cooling tube segment 40 and a small gap 104 is formed between cooling tube 40 and shrink tubing or wrap 102. Thus, in cooling tube assembly 140, a leak anywhere around the circumference of cooling tube segment 40 may be distributed by capillary action within gap 104 to sensor cable 50, regardless of where sensor cable 50 is located on the perimeter of tube segment 40. As shown in FIG. 2A and FIG. 2B the gap is depicted as being uniform about tube segment 40 for convenience. However, such uniformity would not be practical in an actual application, since it is unlikely that the shrink wrap or other wrapping could be controlled so precisely. Rather, in practice, the gap will vary. It is anticipated that the gap will be very small in some places and larger in other places. For example, in FIG. 2B, gap 104 appears to widen as it nears sensor cable 50 (a twisted pair in FIG. 2B). In practice, it is likely that, with a heat shrink tubing used as wrap 102, gap 104 would increase gradually from the small gap shown between the arrows 104 to a gap that approaches the diameter or thickness of sensor cable 50.

Figure 3:
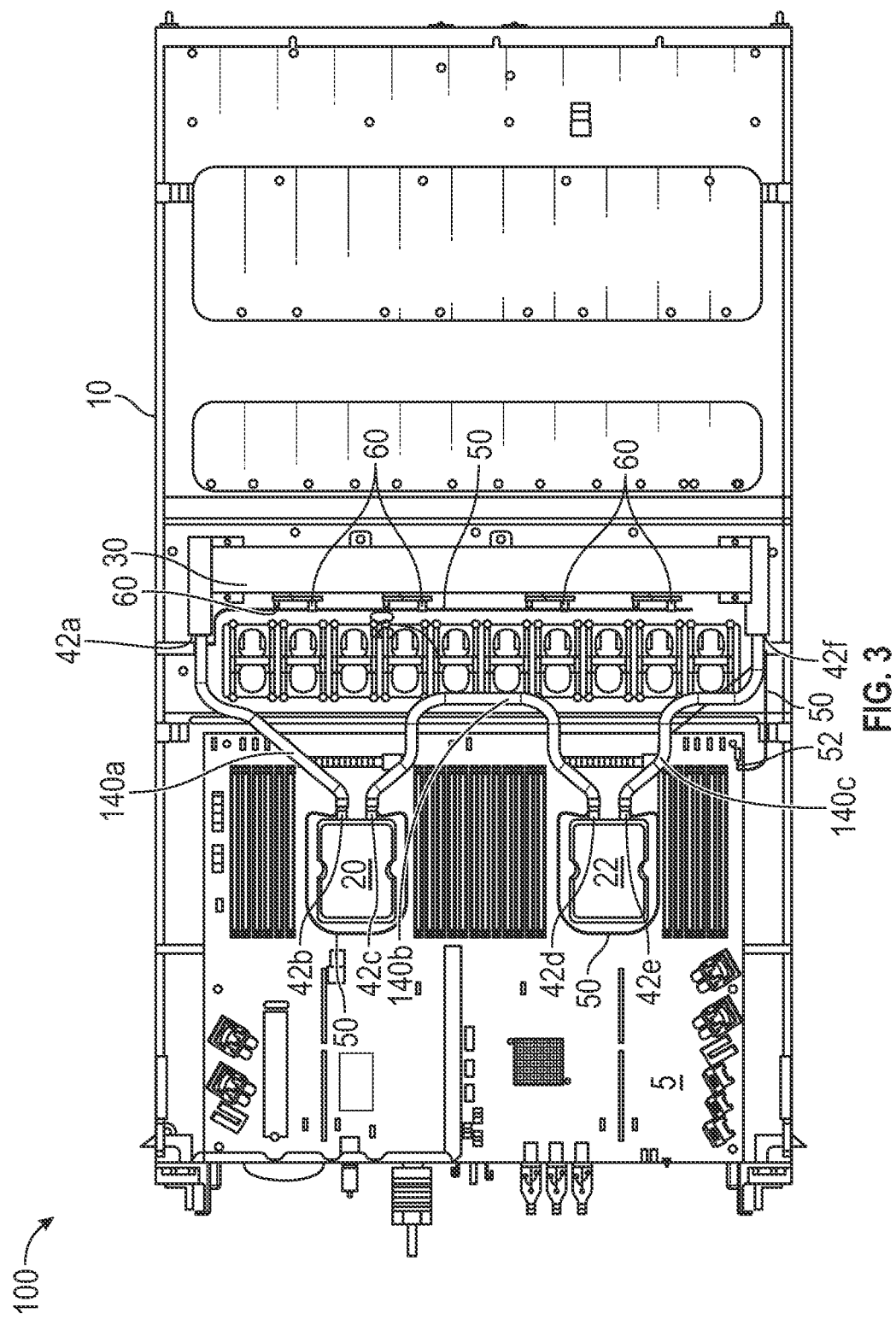
FIG. 3 is a top view of an embodiment of a leak detection apparatus.

In an embodiment, sensor cable 50 may itself segmented, e.g., with each of tube segments 140a . . . 140c including a separate cable segment that is input into motherboard 5 provided with multiple connections 52. In an embodiment, sensor cable 50 may include connections that allow an individual section of tubing (e.g., 40a) to be fitted with a sensor cable segment and shrink wrapped and then installed, and all the individual sensor cables could be connected as a single sensor cable 50 after each tube segment was installed on the motherboard FIG. 3 is a top view of an embodiment of a leak detection system 100. In FIG. 3, cooing tube assemblies 140a . . . 140c are each assembly as described with regard to cooling tube assembly 140 of FIG. 2A and FIG. 2b. Clips 62 are eliminated, since heat shrink tube or wrap 102 presses sensor cable 50 against cooling tube segments within cooling tube assemblies 140a . . . 140c. Tube couplings 42a . . . 42f remain as do the routings of sensor cable 50 about cold plates 20, 22, and along DIMM cooling structure 30 using clips 62. The signal from sensor cable 50 is provided to motherboard 5 at cable connection 52 and processed to provide an alert of the leak.

The previous description is provided to enable any person skilled in the art to practice the various aspects described herein. In the embodiments, the separation of various system components in the embodiments described above should not be understood as requiring such separation in all embodiments. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

A phrase such as an "aspect" does not imply that such aspect is essential to the subject technology or that such aspect applies to all configurations of the subject technology. A disclosure relating to an aspect may apply to all configurations, or one or more configurations. A phrase such as an aspect may refer to one or more aspects and vice versa. A phrase such as a "configuration" does not imply that such configuration is essential to the subject technology or that such configuration applies to all configurations of the subject technology. A disclosure relating to a configuration may apply to all configurations, or one or more configurations. A phrase such as a configuration may refer to one or more configurations and vice versa.

All structural and functional equivalents to the elements of the various aspects described throughout this disclosure that are known or later come to be known to those of ordinary skill in the art are expressly incorporated herein by reference and are intended to be encompassed by the claims.

What is claimed is:

1. An apparatus comprising:
    a first tube segment having a first exterior surface and a first length;
    a sensor cable; and
    a first wrapping, wherein:
    the sensor cable is disposed along the first exterior surface and runs the first length of the first tube segment;
    the first wrapping forces the sensor cable against the first exterior surface with a first gap between the first exterior surface and the first wrapping such that liquid entering the first gap moves within the first gap and contacts the sensor cable; and
    liquid contacting the sensor cable changes an electrical property of the sensor cable.

2. The apparatus of claim 1, wherein the first wrapping includes a shrink-wrap tube provided about the sensor cable and the first tube segment, and the shrink-wrap tube is shrunk, forcing the sensor cable against the first tube segment and defining the first gap.

3. The apparatus of claim 1, wherein the first wrapping includes a shrink-wrap sheet provided about the sensor cable and the first tube segment, and the shrink-wrap sheet is shrunk, forcing the sensor cable against the first tube segment and defining the first gap.

4. The apparatus of claim 1, wherein the sensor cable includes a twisted pair of wires.

5. The apparatus of claim 1, wherein the sensor cable includes a sensor tape.

6. The apparatus of claim 1 further including a processor monitoring the electrical property of the sensor cable and providing an alert when the processor interprets a change in the electrical property as indicating a leak.

7. The apparatus of claim 1 further including
    a second tube segment having a second exterior surface and a second length; and
    a second wrapping, wherein:
    the sensor cable is also disposed along the second exterior surface and runs the second length of the second tube segment;
    the second wrapping forces the sensor cable against the second exterior surface with a second gap between the second exterior surface and the second wrapping such that liquid entering the second gap moves within the second gap and contacts the sensor cable.

8. The apparatus of claim 7, wherein a section of the sensor cable runs from the first tube segment to the second tube segment and the section is not contained within the first wrapping or the second wrapping.

9. The apparatus of claim 8 further including a first tube coupling attached to the first tube segment and a second tube coupling attached to the second tube segment, the first and second tube couplings configured to connect to a cooling element.

10. The apparatus of claim 9, wherein the cooling element includes a cold plate.

11. The apparatus of claim 9, wherein the cooling element includes a dual in-line memory module (DIMM) cooling structure.

12. The apparatus of claim 1, wherein the first gap is not uniform about the first tube segment.

13. The apparatus of claim 12, wherein the first gap is largest at the sensor cable.

* * * * *